United States Patent [19]

Mahon

[11] 4,354,217

[45] Oct. 12, 1982

[54] AUTOMATIC POWER DISCONNECT SYSTEM FOR WAFER SCALE INTEGRATED CIRCUITS

[75] Inventor: Michael J. Mahon, Austin, Tex.

[73] Assignee: Burroughs Corporation, Detroit, Mich.

[21] Appl. No.: 166,477

[22] Filed: Jul. 7, 1980

[51] Int. Cl.³ .............................................. H02H 5/04
[52] U.S. Cl. ..................... 361/104; 361/55;
361/101; 365/200
[58] Field of Search ..................... 361/104, 54, 55, 56,
361/57, 101; 307/200 A; 365/200

[56] References Cited

U.S. PATENT DOCUMENTS 3,493,815  2/1970  Hurtle ........................... 361/104 X
3,941,975  3/1976  Newman et al. ............... 361/104 X
4,007,452  2/1977  Hoff, Jr. ................................ 365/63

FOREIGN PATENT DOCUMENTS 2703255  8/1978  Fed. Rep. of Germany ...... 361/104

*Primary Examiner*—Reinhard J. Eisenzopf
*Attorney, Agent, or Firm*—M. L. Young; K. R. Peterson

[57] ABSTRACT

This disclosure relates to a wafer scale power interconnect system by which defective circuits on the wafer can be automatically disconnected from the power and ground lines supplied to each of the circuits. The disconnect device employs a gate between the power source and the circuit, which gate is controlled by a fuse that can be destroyed by an excessive current thereby opening the gate. The disconnect device may also be just such a fuse or a current limiter.

7 Claims, 8 Drawing Figures

AUTOMATIC POWER DISCONNECT SYSTEM FOR WAFER SCALE INTEGRATED CIRCUITS

BACKGROUND OF THE INVENTION

1. Field of the Invention

This invention relates to an interconnect system for wafer scale integrated circuits and more particularly to an automatic power disconnect system employed with a network of circuits on the wafer such as processors, memories and other devices.

2. Description of the Prior Art

Increasing attention has been given in the prior art to wafer scale integrated circuits as evidenced by the Canning et al U.S. Pat. No. 3,641,661, the Cook U.S. Pat. No. 3,810,301, and the Kilby U.S. Pat. No. 3,835,530.

Signal propagation in any circuit is limited by the velocity of electromatic waves in the conductor medium and, theoretically, by the speed of light. Switching speeds in today's integrated circuits are approaching one nanosecond, during which time the distance over which the signal propagation occurs is approximately 15 centimeters in a printed circuit board. To achieve faster switching speeds, or conversely smaller signal propagation times, it has been recognized that the interconnections between the respective circuits and components must be significantly shorter. This is achieved by wafer scale integration where a large number of discrete circuits are interconnected on a single crystalline substrate, as distinct from the current practice of forming such circuits on individual dice which are then separately packaged and mounted on a printed circuit board.

Wafer scale integration has the advantage of increased wiring densities compared to printed circuit boards as well as a reduction in the number of circuit interconnections required between the respective dice or chips and also a reduction in the number of handling and packaging steps for such chips.

A particular concern in regard to wafer scale integrated circuits is that of manufacturing yield. With today's production processes, about 30 percent of the integrated circuit dice or chips are found to be defect-free and viable. As the size of the chips increase, the probability of defects also increases, thereby reducing production yield. Thus, wafer scale integrated circuits would have to employ a larger number of redundant circuits with each circuit occupying as small a proportion of the wafer as possible. After most of the fabrication steps of the wafer, but before the metalllization or interconnection step, each of the individual circuits is tested to see if it is in working order and, then, only viable circuits are interconnected by specially created masks during the final metallization step. Such techniques are disclosed in the Hoff, Jr. U.S. Pat. No. 4,007,452. Another approach has been to interconnect all the circuits or chips and then destroy connections to defective chips.

With the approach of wafer scale integration, it has been recognized that a number of different circuits or subsystems required for any particular system can be implemented on such an integrated circuit wafer. In fact, a number of redundant circuits or subsystems can be implemented for later connection to create a plurality of such systems as required by the demand for such systems and the resources available. Such subsystems could be interconnected during fabrication as described above and selected or assigned to a particular system by various addressing techniques to create a parent system that could then expand or contract as required by the particular task that was being performed. For example, a tree-like network could be obtained by starting with one device which is arbitrarily designated at the top and connected to the external world. All end results are reported up the tree to the external world. Additional devices would be addressed for connection to this "parent", and in turn would have downward connections to their children.

However, it is difficult, with a rigid tree-type system, to map a problem onto the actual physical system in a manner that does not leave a large portion of the devices on one side of the physical tree in an un-utilized state. It may turn out that the parallelism is skewed and tends to push the problem onto only one side of the tree with the rest of the actual physical resources not being used. It is desirable, of course, to utilize as many resources as fully as possible on any given problem or task, and to have networks that can expand or contract as required.

A particular problem with a tree-type network is that if one of the devices somewhere in the tree were to fail, it cuts off communication to its children and their children and so on down the tree. It is possible that a plurality of different types of detection techniques or diagnostic means can be provided so as to determine, during the running of a particular task or problem, if in fact any particular device is unusable, and to alter the network so as to maintain the network in a viable condition. However, any results that were in the system at the time of a particular device failure would be lost. Therefore, it is desirable to have a network that could be rearranged to exclude the failed device.

While communications between the various devices of the architectures described above can be initiated and terminated by various addressing techniques, there is still the problem in a wafer scale integrated circuit of disconnecting power to the failed circuits or subsystems. Although such failed circuits or devices would no longer be employed in the working network, they would still constitute a power drain as well as contribute to the heat dissipation problems associated with such a wafer scale integrated circuit.

It is, then, an object of the present invention to provide a system for automatically disconnecting power leads to various devices in a wafer scale integrated circuit.

It is another object of the present invention to provide a wafer scale implemented system, the various circuits of which can be automatically disconnected after the system has been packaged and placed in use.

It is still a further object of the present invention to provide a wafer scale implemented system in which circuits can be automatically disconnected to contract the system.

SUMMARY OF THE INVENTION

In order to achieve the above-identified objects, the present invention is directed to an automatic power disconnect means for employment with the various circuits implemented on a crystalline wafer so that a particular circuit can be disconnected when it has developed a defect or short. The disconnect means employs a gate between the power source and the circuit, which gate is controlled by a fuse that can be destroyed by an excessive current thereby opening the gate.

A feature, then, of the present invention resides in a power disconnect means for employment with a plurality of circuits implemented on a crystalline wafer substrate.

BRIEF DESCRIPTION OF THE DRAWINGS

The above and other objectives, advantages and features of the present invention will become more readily apparent from a review of the following specification when taken in conjunction with the drawings wherein.

GENERAL DESCRIPTION OF THE INVENTION

The present invention is directed toward a power interconnect system for wafer scale integrated circuitry which may implement a plurality of networks of processors, memories and the like, which networks are designed to expand or contract as the various tasks of the networks require; or the present invention could be employed with such wafer scale integrated circuitry wherein a memory system is implemented on the wafer, which system is made up of a plurality of individual memory circuits such as might be found in prior art integrated dice or chips. In the latter case, access to the respective memories could be by way of a common bus distributed throughout the wafer, to which individual memory circuits are connected and accessed by appropriate addressing techniques. In the former case, a common bus could not be utilized if more than one network were to be operated at any given time. In either case, the capacity of the networks would be determined by the yield or number of viable defect-free circuits that existed in the wafer at the end of the manufacturing process. In addition, the maxium number of viable circuits available would decrease after the wafer had been packaged and placed in use in the field. Defective circuits detected at the time of fabrication would not be connected to the common power and ground supplies so as to minimize power drain and resultant heat dissipation. However, it is desirable to be able to disconnect circuits from the power and ground supplies after the wafer has been placed in service so as to maintain the wafer in operational condition for as long as possible.

To this end, the present invention is directed toward a power interconnect system for wafer scale integrated circuits where common power and ground conductors which are supplied to the viable circuits on the wafer can be subsequently disconnected. At relatively high current levels, a faulty or defective circuit would not necessarily draw more current than a viable circuit would draw. Thus, while the above-identified Hoff, Jr. Pat. No. 4,007,452 discloses the employment of "discretionary" switches with wafer scale circuitry to connect circuits to a power line after they have been tested and found to be defect-free, such switches could not simply be replaced by well known fuses to accomplish the objects of the present invention.

Figure 1:
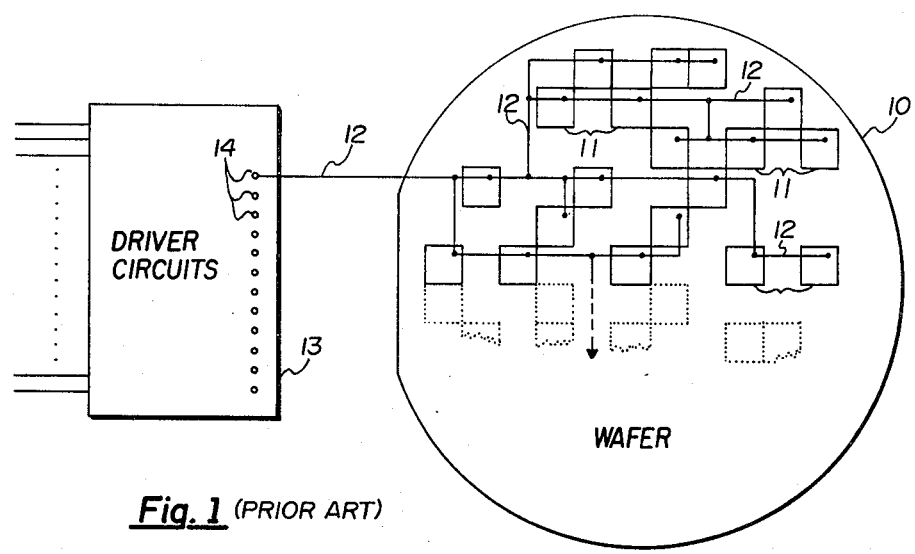
FIG. 1 is a plan view of a prior art wafer that might employ the present invention.

A typical wafer of the type that might be employed in the prior art and also with the present invention is illustrated in FIG. 1. Wafer 10 is fabricated with a number of non-defective circuits 11 as well as a number of defective circuits (not shown). Circuits 11 are connected by way of buses 12 during metallization by one of a variety of different means. Respective buses 12 are then connected to driver circuits implemented in package 13. Alternatively, all circuits can be interconnected at fabrication and by selective addressing defective circuits can be ignored. However, in the latter case, it is then required that the power connections be disconnected. Even in the former case it is desirable to be able to disconnect circuits that fail once the wafer has been placed in service.

Figure 2:
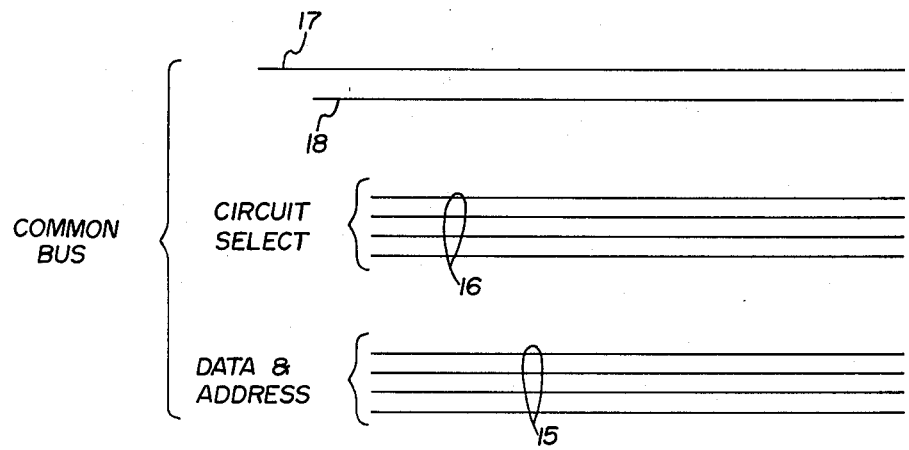
FIG. 2 is a schematic representation of a communication and power bus that might be employed with the present invention.

A typical bus 12 of FIG. 1 is illustrated in FIG. 2 and includes data and address lines 15 and also circuit select lines 16 as well as power line 17 and ground line 18.

Figure 3B:
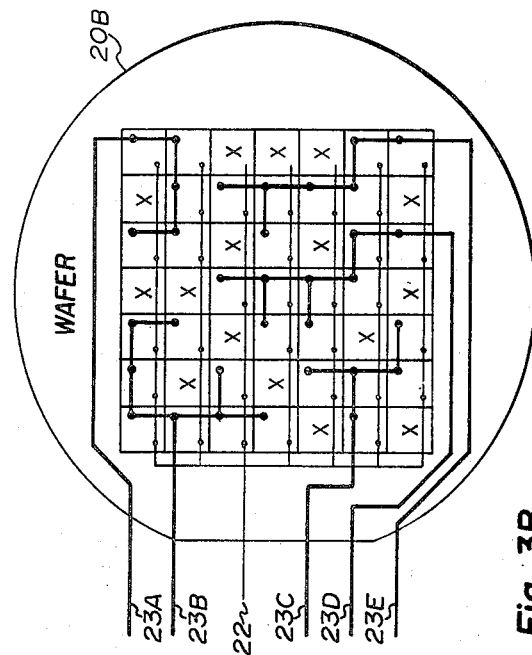
FIGS. 3A and 3B are representations of different systems embodying the present invention.
Figure 3A:
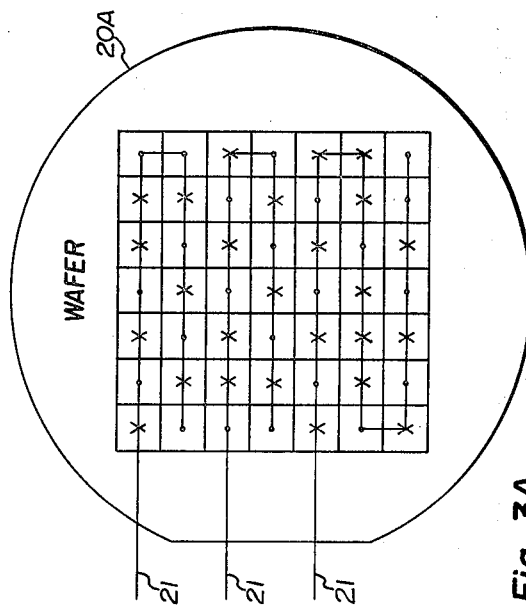

In the situation where the wafer implements a memory system, where all or at least a substantial portion of the circuits are similar, access to the respective memory circuits would be by way of one or more of common buses 21, such as illustrated in FIG. 3A. The circuits or dice which are defective are denoted by X's and either never were connected to the respective buses or were later disconnected as by the present invention. In the situation of the embodiment of FIG. 3A, the access bus would be of the type described above in relation to FIG. 2.

In the embodiment illustrated in FIG. 3A where different types of circuits such as processors, memories and the like are provided in groups associated with separate systems, there can be a redundancy in the number of different circuits so that a failure of one of the circuits would not render the system inoperable. If a given circuit were to fail during operation of the wafer, the capability of the corresponding system would be reduced but it would still be able to function.

Another embodiment of the present invention is illustrated in FIG. 3B. In this embodiment, common buses are not employed and communication between the respective circuits is by way of connections between each circuit and its neighbors. In this embodiment, the circuits would be a number of processors and/or memories and the like, with each circuit being accessed by way of separate buses 35 from each of its neighbors so that individual systems could be initiated, which systems could expand or contract depending upon the tasks involved and the resources available. As each system expanded or contracted, it would have to expand around defective circuits which are illustrated in FIG. 3B by X's. Such individual systems are indicated in FIG. 3B as 23A . . . E. Since common buses are not employed, the bus arrangement between circuits would differ from that illustrated in FIG. 2. However, each circuit would be supplied with power from a separate arrangement of power and ground conductors 22.

DETAILED DESCRIPTION OF THE INVENTION

Figure 4A:
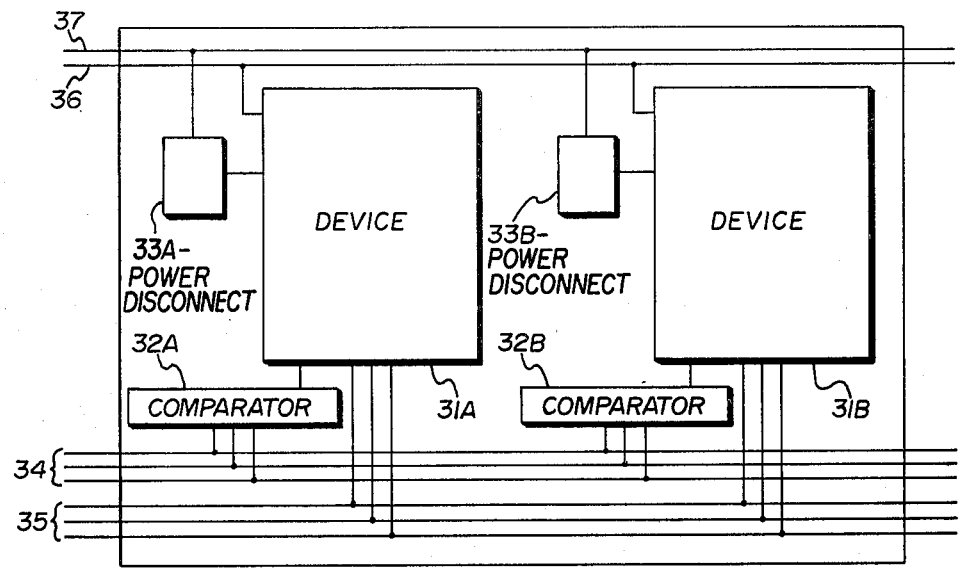
FIGS. 4A and 4B are schhematic representations of circuits employing the present invention.

One embodiment of the present invention is illustrated in FIG. 4A. as shown therein, two circuit devices, 31A and B, are adjacent to one another on the wafer circuit and accessed by circuit select lines 34 and data and address lines 35. Also common to the respective devices is ground line 36 and power line 37. Each of the devices 31A and B are directly connected to ground line 36. However, each device is coupled to power line 37 by way of power disconnect circuits 33A and B respectively.

The arrangement illustrated in FIG. 4A is adapted primarily for memory arrays which could be accessed by a common bus. Such an arrangement could also be applied to a limited number of processors and other devices with interleaved communication over the respective address and data lines 35. However, for a larger array of processors such as contemplated by one embodiment of the present invention, communications between the respective devices would be from device to device such as illustrated in FIG. 4B.

Figure 4B:
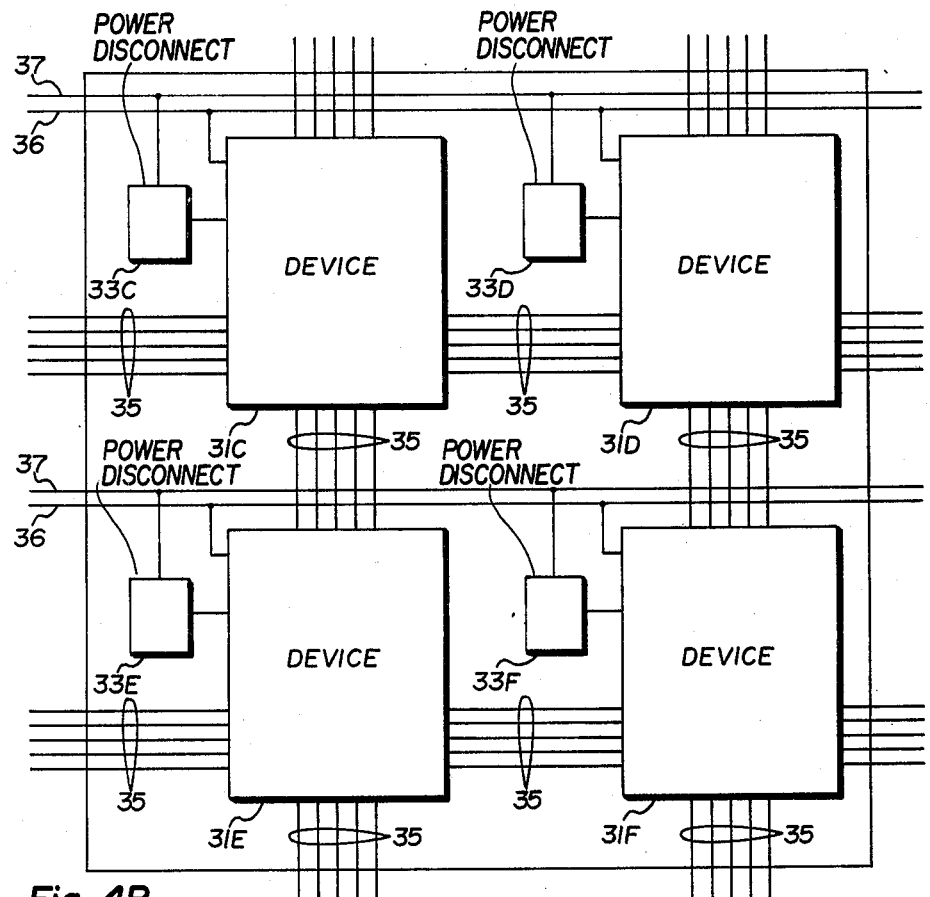

In FIG. 4B, communications between respective devices 31C . . . F are by way of the various data lines 35. Power line 37 and ground line 36 are now the only global connections to the respective devices. Ground line 36 is connected directly to each of the devices. However, power line 37 is connected to the respective devices by power disconnect circuits 33C . . . F. The simplest power disconnect circuit for achieving disconnection is a fuse such as a Nichrome fuse in the power connection to the circuit. When the current requirement of a given circuit exceeds the design maximum, that fuse, is destroyed or blown thereby disconnecting the power permanently.

In many situations, such fuses cannot be fabricated so as to accommodate both a continuous operating current and stil allow the destruct current to be presented to the fuse. This likelihood is minimized when the various circuits are driven at a sufficiently low operating current. In such situations, and especially in the situation of FIG. 4B where only power and ground conductors are required to be globally distributed, conservative design rules can be employed in laying out the power and ground conductors without having to provide a large portion of the circuit area for all of the various connections to be made to the respective circuits. For example, the respective power and ground conductors can be fabricated with a much larger width so as to minimize openings in the respective conductors and also spaced more widely apart so as to minimize shorts therebetween.

If the required operating current is sufficiently low, the crystalline substrate can be metallized on its backside so as to provide the common ground return and, then, the power conductor need be the only global connection to be distributed on the circuit-side of the wafer. Under these circumstances, the chances of a wafer-disabling short would be considerably minimized.

Figure 5A:
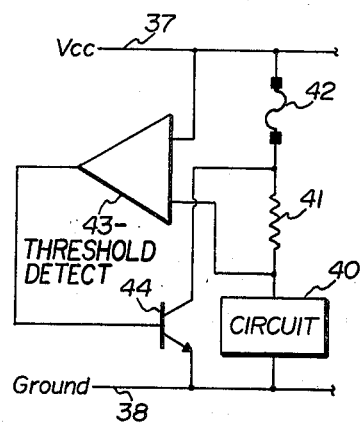
FIGS. 5A and 5B are schematic representations of different embodiments of the present invention.

When the current requirement of the various circuits is sufficiently high such that fuses cannot be fabricated to meet all of the design maximums, the respective power disconnection circuits 33A . . . F of FIGS. 4A and B are designed to sense the current flow. When the current exceeds the design threshold, it destroys the fuse. Such current sensing would be by way of a means to sense the voltage drop across a series resistance and even the fuse itself. A current-sensing power disconnect circuit is illustrated in FIG. 5A. As shown therein, circuit 40 is connected between power conductor 37 and ground conductor 38 by way of resistor 41 and fuse 42. Resistor 41 is optional. Differential amplifier and threshold detector 43 is provided from circuit 40 to power line 37 in parallel with resistor 41 and fuse 42. When amplifier and detector 43 detects a sufficiently high current to circuit 40 it generates a signal to place gate 44 in a conducting condition. This shorts out the connection between power conductor 37 and ground conductor 38 thereby destroying fuse 42. Gate 44 is illustrated in FIG. 5A as being a bipolar transistor but could also be a MOS transistor.

Figure 5B:
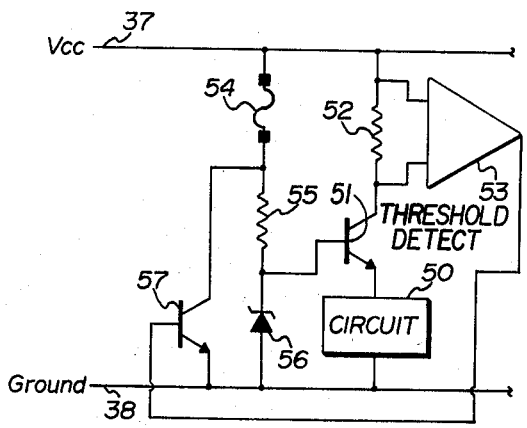

In situations where a fuse cannot be constructed to carry the total current requirements of the particular circuits, it is then employed as a non-volatile "storage device" to control a current-switching gate which actually applies power to the circuit. Such an embodiment is illustrated in FIG. 5B. In this embodiment, circuit 50 is connected between power line 37 and ground line 38 by way of gate 51 and current-sensing resistor 52. Gate 51 is maintained in a conductive condition by a current supplied from power line 37 by way of fuse 54 and resistor 55. They are in series with Zener diode 56 which is optional. Current threshold detector 53 is provided in parallel with current-sensing resistor 52 to detect when its current has exceeded design maximums and in turn generates a signal to place gate 57 in a conducting condition, thereby connecting fuse 54 directly to ground and destroying the fuse. This turns off the current to gate 51 and the power to circuit 50.

Since the primary purpose of power disconnection is to prevent uncontrolled increase in current requirements of the overall wafer, it may not be necessary to actually disconnect the respective circuits but only to limit their current. In this situation, the respective power disconnection circuits 33A . . . F of FIGS. 4A and B would then be designed as current limiters.

EPILOGUE

A wafer scale interconnect system has been disclosed above by which selected circuits such as defective circuits on the wafer can be disconnected from the power and ground lines suppliedc to each of the circuits. Such disconnection can be achieved at the time the wafer is fabricated and packaged or such disconnection can be made after the packaged wafer has been placed in use and incurs a subsequent defective circuit. Furthermore, in one embodiment, the respective circuits on the wafer can be automatically disconnected from the respective power and ground lines.

While but a few embodiments of the present invention have been described above, it will be apparent to one skilled in the art that variations and modifications can be made therein without departing from the spirit and the scope of the invention as claimed.

What is claimed is:

1. An integrated circuit structure comprising:
   a crystalline substrate having a plurality of functional circuits formed on the surface thereof; and
   a pair of power supply conductors on said surface and provided for connection to each of said functional circuits;
   each of said function circuits including a power disconnect circuit coupled in series with said functional circuit between said respective power supply conductors, said power disconnect circuit including a power disconnect means to disrupt the current supplied to said function circuit in response to an increase in that current;
   said power disconnect circuit including a fuse and a resistor coupled in series between said functional circuit and one of said power supply conductors, a threshold detection amplifier coupled in parallel with said fuse and resistor, said fuse being coupled to said one of said conductors, and a gate coupled to the output of said threshold detection amplifier, said gate being coupled between said fuse and other of said power supply conductors such that a current through said fuse and resistor which exceeds a given threshold places said gate in a conducting condition to form an electrical path from said fuse to the other of said power supply conductors.

2. An integrated circuit structure according to claim 1 further including:
a common communications bus;
said functional circuits including a plurality of memory circuits coupled to said common communication bus.

3. An integrated circuit structure according to claim 1 wherein:
said functional circuits include a plurality of processors each coupled in communication with its neighboring processors.

4. An integrated circuit structure according to claim 1 wherein:
said functional circuits include a plurality of processors and memory circuits, each coupled in communication with its neighboring circuits.

5. An integrated circuit structure comprising:
a crystalline substrate having a plurality of function circuits formed on the surface thereon; and
a pair of power supply conductors provided on said surface for connection to each of said circuits;
each of said function circuits including a power disconnect circuit coupled in series with said functional circuit between said respective power supply conductors, said power disconnect circuit including a resistor and a gate in series with said functional circuit, a threshold detection amplifier coupled in parallel with said resistor and a second gate coupled to the output of said threshold detection amplifier, said second gate being coupled between said power supply conductors by a fuse so that when the current through said resistor exceeds a given threshold said second gate will be normally placed in a conducting condition to form an electrical path from said fuse to the other of said power supply conductors to destroy said fuse and open said a gate to disrupt the current supplied to said functional circuit in response to an increase in current through said resistor.

6. An integrated circuit structure according to claim 5 further including:
a common communications bus;
said functional circuits including a plurality of memory circuits coupled to said common communications bus.

7. An integrated circuit structure according to claim 5 wherein:
said functional circuits include a plurality of processors each coupled in communication with its neighboring processors.

* * * * *